(12) United States Patent
Hirose et al.

(10) Patent No.: US 9,169,558 B2
(45) Date of Patent: Oct. 27, 2015

(54) FLUID CONTROL APPARATUS

(75) Inventors: Jun Hirose, Nirasaki (JP); Kazuyuki Tezuka, Nirasaki (JP); Yohei Uchida, Nirasaki (JP); Mutsunori Koyomogi, Osaka (JP); Takahiro Matsuda, Osaka (JP); Ryousuke Dohi, Osaka (JP); Kouji Nishino, Osaka (JP); Nobukazu Ikeda, Osaka (JP)

(73) Assignees: TOKYO ELECTRON LIMITED, Tokyo (JP); FUJIKIN INCORPORATED, Osaka-shi (JP)

( * ) Notice: Subject to any disclaimer, the term of this patent is extended or adjusted under 35 U.S.C. 154(b) by 1086 days.

(21) Appl. No.: 13/203,866

(22) PCT Filed: Nov. 6, 2009

(86) PCT No.: PCT/JP2009/068982
§ 371 (c)(1),
(2), (4) Date: Oct. 13, 2011

(87) PCT Pub. No.: WO2010/100792
PCT Pub. Date: Sep. 10, 2010

(65) Prior Publication Data
US 2012/0031500 A1    Feb. 9, 2012

(30) Foreign Application Priority Data
Mar. 3, 2009    (JP) .................................. 2009-049045

(51) Int. Cl.
C23C 16/455    (2006.01)
H01L 21/67    (2006.01)

(52) U.S. Cl.
CPC ..... C23C 16/45561 (2013.01); *H01L 21/67017* (2013.01); *Y10T 137/0396* (2015.04)

(58) Field of Classification Search
CPC ........... G05D 7/0641; C23C 16/45561; H01L 21/67017
USPC ................................................ 137/487.5, 486
See application file for complete search history.

(56) References Cited

U.S. PATENT DOCUMENTS

| 5,394,755 A | 3/1995 | Sudo et al. |
| 5,862,986 A | 1/1999 | Bolyard, Jr. et al. |
| 6,158,679 A * | 12/2000 | Ohmi et al. ................... 239/589 |
| 6,210,482 B1 * | 4/2001 | Kitayama et al. ............. 118/715 |

(Continued)

FOREIGN PATENT DOCUMENTS

| JP | 06-119059 A | 4/1994 |
| JP | 10-066922 A | 3/1998 |

(Continued)

OTHER PUBLICATIONS

International Search Report dated Dec. 8, 2009, issued for PCT/JP2009/068982.

*Primary Examiner* — Craig Schneider
*Assistant Examiner* — Nicole Wentlandt
(74) *Attorney, Agent, or Firm* — Oblon, McClelland, Maier & Neustadt, L.L.P.

(57) ABSTRACT

To provide a fluid control apparatus capable of reducing the space, while reducing the cost. A fluid control apparatus has a fluid controlling unit and a fluid introducing unit. The fluid introducing unit is divided into three parts: a first and a second inlet-side shutoff/open parts disposed on the inlet side, each made up of 2×N/2, disposed between the first and second inlet-side shutoff/open parts and the fluid controlling unit.

6 Claims, 7 Drawing Sheets

(56) References Cited

U.S. PATENT DOCUMENTS

| | | | |
|---|---|---|---|
| 6,450,190 B2 * | 9/2002 | Ohmi et al. | 137/14 |
| 7,775,236 B2 * | 8/2010 | Gold et al. | 137/487.5 |
| 8,074,677 B2 * | 12/2011 | Gold et al. | 137/487.5 |
| 8,418,714 B2 * | 4/2013 | Ohmi et al. | 137/486 |
| 8,731,727 B2 * | 5/2014 | Toppari et al. | 700/282 |
| 8,769,733 B2 * | 7/2014 | Galyean et al. | 4/601 |
| 2001/0013363 A1 * | 8/2001 | Kitayama et al. | 137/7 |
| 2008/0202610 A1 * | 8/2008 | Gold et al. | 137/597 |

FOREIGN PATENT DOCUMENTS

| | | |
|---|---|---|
| JP | 2000-322130 A | 11/2000 |
| JP | 2000-323464 A | 11/2000 |
| JP | 3387849 B2 | 11/2000 |
| JP | 2002-206700 A | 7/2002 |
| JP | 2003-091322 A | 3/2003 |

* cited by examiner

FLUID CONTROL APPARATUS

TECHNICAL FIELD

The present invention relates to a fluid control apparatus used in a semiconductor production apparatus or the like, and in particular, to a fluid control apparatus formed by integration of a plurality of fluid control devices.

BACKGROUND ART

In a fluid control apparatus used in a semiconductor production apparatus, integration has been advanced in such a manner that a line is formed by arranging a plurality of fluid control devices in series and connecting them without using a pipe or a connector, and a plurality of such lines are installed in parallel on a base member (Patent document 1 and Patent document 2).

In a fluid control apparatus of Patent document 1, as shown in FIG. 7, one process gas control line (fluid control line) is formed of one flow rate controller (21) serving as a basic constituting element, and a plurality (the same number as that of flow rate controllers (21)) of process gas control lines L1 to L16 are arranged in parallel to form the fluid control apparatus. The line P further added to the fluid control lines L1 to L16 in parallel is a purge gas line.

In FIG. 7, each of the process gas control lines L1 to L16 has a filter (24), two inlet-side on-off valves (23) on the inlet side, a flow rate controller(mass flow controller) (21) and an outlet-side on-off valve (25) from the inlet side, and an outlet part that is common to the process gas control lines L1 to L16 is also provided with an on-off valve (26).

In such a fluid control apparatus, fluid (gas) does not constantly flow through all the process gas control lines L1 to L16, and gas is conveyed to a downstream chamber while gases of different kinds or different flow rates are sequentially varied using 2 to 3 lines, and the flow rate is adjusted by a flow rate controller (21). The mass flow controller used as the flow rate controller (21) incorporates a flow rate sensor, a control valve and the like, and requires expensive and frequent maintenance, leading increase in the overall cost. On the other hand, in a fluid control apparatus used in a semiconductor production apparatus, the trend of increase in number of kinds of fluids leads the problem of increase in space and cost.

A fluid control apparatus of Patent document 2 has a fluid controlling unit in which M fluid control lines each having a flow rate controller as a basic constituting element, one inlet, and one outlet are arranged, and a fluid introducing unit formed of a plurality of on-off valves so that the number of inlets is N (>M) and the number of outlets is M, wherein M outlets of the fluid introducing unit and M inlets of the fluid controlling unit are one-on-one connected.

Assigning the apparatus of Patent document 2 to the conventional fluid control apparatus shown in FIG. 7, it has a fluid controlling unit (2) in which M (8 in the drawing) fluid control lines L1 to L8 each having the flow rate controller (21) as a basic constituting element, and a fluid introducing unit (3) formed of a plurality of on-off valves (23) so that the number of inlets is N (16 in the drawing) and the number of outlets is M as shown in FIG. 6.

In the same drawing, each of the fluid control lines L1 to L8 is a line of controlling process gas, and one purge gas line P is provided in parallel with these.

As a flow rate controller (21), a mass flow controller is used. Since the mass flow controller (21) has relatively narrow flow rate adjustable range, even for the same kind of fluid, a separate mass flow controller (21) is used when the flow rate adjustment range differs, and flow rates of M kinds of process gases (including the same process gas with different flow rates) can be adjusted by means of the M fluid control lines L1 to L8.

The fluid introducing unit (3) includes N×M on-off valves (23), and the M outlets of the fluid introducing unit (3) and the M inlets of the fluid controlling unit (2) are connected one-on-one.

Each of the N inlets of the fluid introducing unit (3) is provided with the filter (24) and a manual valve (27). Each of the M fluid control lines L1 to L8 is provided with two outlet-side on-off valves (25). On the outlet side of the fluid controlling unit (2), a pressure switch (28), the filter (24), and the on-off valve (26) that are common to the fluid control lines L1 to L8 are provided.

As the flow rate controller, besides the mass flow controller, a pressure type is also known (see Patent document 3 for reference).

Patent document 1: Japanese Unexamined Patent Publication No. 2002-206700
Patent document 2: Japanese Unexamined Patent Publication No. 2000-323464
Patent document 3: Japanese Patent Publication No. 3387849

DISCLOSURE OF INVENTION

Problem to be Solved by the Invention

In comparison with the fluid control apparatus shown in FIG. 7, the fluid control apparatus shown in the above FIG. 6 has an advantage that the number of the fluid control lines including the flow rate controller (21) that is relatively costly and troublesome in maintenance is reduced to 8 (M) from 16 (N), but has a problem that the advantage is not sufficiently taken when the number of inlets is intended to be increased because the number of on-off valves (23) significantly increases.

It is an object of the present invention to provide a fluid control apparatus capable of reducing the space, while reducing the cost.

Means for Solving the Problem

A fluid control apparatus according to the present invention includes: a fluid controlling unit including M fluid control lines each having one flow rate controller as a basic constituting element, one inlet and one outlet, and a fluid introducing unit adapted to have N (<M) inlets and M outlets by a plurality of on-off valves, and the M outlets of the fluid introducing unit and M inlets of the fluid controlling unit are connected one-on-one, and the fluid introducing unit is divided into an inlet-side shutoff/open part made up of a plurality of on-off valves, disposed on the inlet side, having a total of N inlets and a total of K outlets, and a fluid controlling unit-side shutoff/open part made up of a plurality of on-off valves, disposed between the inlet-side shutoff/open part and the fluid controlling unit, having a total of K inlets and a total of M outlets, and the inlet-side shutoff/open part is divided into a plurality of groups each having two or more required number of on-off valves.

The fluid control apparatus has N inlets and M outlets, and is able to adjust the flow rates of N kinds of fluids by using M fluid control lines (for example, L1 to L8).

One fluid control line is formed by a flow rate controller alone, or by connecting a required fluid control device to a flow rate controller. Here, the fluid control device means a fluid control apparatus constituting element other than a flow rate controller (mass flow controller or fluid variable type flow rate controller), and as the fluid control devices, an on-off valve (valve executing shut off or opening of fluid passage), a pressure reducing valve, a pressure display, a filter, a pressure switch and the like are appropriately used. The fluid control devices required for the fluid control apparatus are arranged in appropriate sites while they are classified into those provided at each of N inlets of the fluid introducing unit, those provided at each of M fluid control lines, and those provided commonly for M fluid control lines at an outlet of the fluid controlling unit.

One fluid control line is so configured that a plurality of block-like connector members on the lower level layer are attached to a movable rail with a male screw members, and a plurality of fluid control devices and flow rate controllers on the upper level layer are attached to the connector members with a screw member from above so that they stride neighboring connector members.

In general, an inlet-side shutoff/open part having a total inlet number of N and a total outlet number of K includes N×K on-off valves, and a fluid controlling unit-side shutoff/open part having a total inlet number of K and a total outlet number of M includes K×M on-off valves. When the inlet-side shutoff/open part is divided into a plurality of (for example, two or four) groups each having two or more required number of on-off valves, however, the total number of on-off valves of the inlet-side shutoff/open part is reduced to N×K/2 when it is divided into two groups, and to N×K/4 when it is divided into four groups.

For example, the fluid introducing unit may include a first and a second inlet-side shutoff/open parts respectively including N1×2 on-off valves and (N−N1)×2 on-off valves, and a fluid controlling unit-side shutoff/open part including 4×M on-off valves. N1 is, for example, N/2. N is a number of inlets, and M is a number of outlets. In this case, the number of outlets is made four with respect to an inlet number N of four (fluid kinds are limited to a maximum of four kinds, including two kinds for each inlet-side shutoff/open part) by the first and second inlet-side shutoff/open parts, and the four kinds of fluids are distributed to one of the M outlets by the fluid controlling unit-side shutoff/open part. In this manner, it is possible to reduce the number of on-off valves required for constituting the fluid introducing unit.

The fluid introducing unit may include a first to a fourth inlet-side shutoff/open parts respectively including N1, N2, N3 and N4 on-off valves, provided that N=N1+N2+N3+N4, and a fluid controlling unit-side shutoff/open part including 4×M on-off valves. For example, N1=N2=N3=N4=N/4. N is a number of inlets, and M is a number of outlets, and in this case, the number of outlets with respect to an inlet number N is made four (fluid kinds are limited to a maximum of four kinds, including one kind for each inlet-side shutoff/open part) by the first to fourth inlet-side shutoff/open parts, and the four kinds of fluids are distributed to one of the M outlets by the fluid controlling unit-side shutoff/open part. In this manner, it is possible to further reduce the number of on-off valves required for constituting the fluid introducing unit.

The fluid introducing unit may include a first to a fourth inlet-side shutoff/open parts each including N/4 on-off valves, and a first and a second fluid controlling unit-side shutoff/open parts each including 2×M/2 on-off valves. N is a number of inlets, and M is a number of outlets, and in this case, the number of outlets with respect to an inlet number N is made four (fluid kinds are limited to a maximum of four kinds, including one kind for each inlet-side shutoff/open part) by the first to fourth inlet-side shutoff/open parts, and four kinds of fluids are distributed to one of the M outlets by the first and second fluid controlling unit-side shutoff/open parts. In this manner, it is possible to reduce the on-off valves of the fluid controlling unit-side shutoff/open part, and to further reduce the number of on-off valves required for constituting the fluid introducing unit.

As the flow rate controller, for example, a mass flow controller may be used, and the mass flow controller may be made up of a main body formed with an inlet passage and an outlet passage, a flow rate sensor and a piezoelectric element-type control valve attached to the main body, and may be made up of an on-off control valve, a pressure sensor, a diaphragm part, a flow rate sensor and a controlling unit.

As the flow rate controller, it may be a pressure type (pressure type flow rate control device), and an example of such a flow rate controller is of a pressure type that executes flow rate control of a fluid while keeping upstream pressure of an orifice about twice or more downstream pressure, the flow rate controller including an orifice formed by piercing a fine hole in a metal thin sheet, with a desired flow rate characteristic, a control valve provided upstream the orifice, a pressure detector provided between the control valve and the orifice, and an operation control device that operates flow rate Qc from a detected pressure P of the pressure detector according to Qc =K×P (K is a constant), and outputs a difference between a flow rate command signal Qs and the operated flow rate signal Qc to a driving part of the control valve as a control signal Qy, and the upstream pressure of the orifice is adjusted by opening/closing of the control valve to control the flow rate downstream the orifice.

According to the flow rate controller of a pressure type, since it is possible to adjust flow rates of plural kinds of fluids by one pressure-type flow rate controller, M fluid control lines having M flow rate controllers can be replaced by M fluid control lines having the m (<M) pressure-type flow rate controllers. In this manner, it is possible to reduce the number of flow rate controllers used in the fluid controlling unit while keeping the number of inlets the same as the number of outlets.

EFFECT OF THE INVENTION

According to the fluid control apparatus of the present invention, since M (<N) fluid control lines are assigned to the number of inlets N, it is possible to reduce the number of the flow rate controllers that cause increase in cost, and to reduce the overall cost. Further, since the number of on-off valves of the fluid introducing unit including a plurality of on-off valves can be prevented from increasing, the cost can be further reduced, and the installation space as a whole is reduced.

Figure 1:
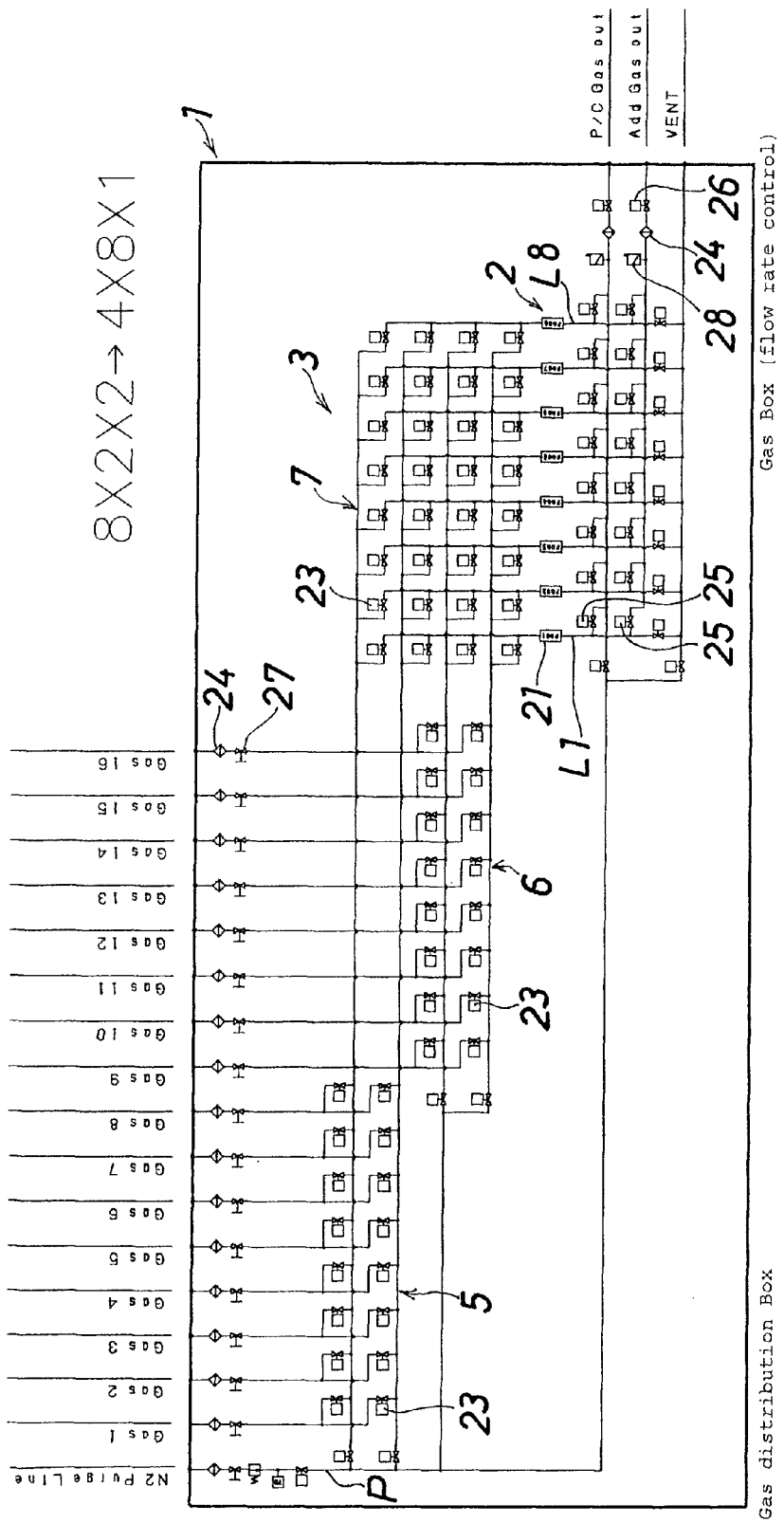
FIG. 1 is a flow chart showing a first embodiment of the fluid control apparatus according to the present invention.

DESCRIPTION OF REFERENCE SIGNS (1) Fluid control apparatus
(2)(4) Fluid controlling unit
(3) Fluid introducing unit
(5)(6) First and second inlet-side shutoff/open parts
(7) Fluid controlling unit-side shutoff/open part
(8)(9)(10)(11) First to fourth inlet-side shutoff/open parts
(12)(13) First and second fluid controlling unit-side shutoff/open parts
(21)(22) Flow rate controller
(23) On-off valve
(31) Control valve
(32) Driving part
(33) Pressure detector
(34) Orifice
(42) Operation control circuit (operation control device)
L1 to L8 Fluid control lines

BEST MODE FOR CARRYING OUT THE INVENTION

Figure 6:
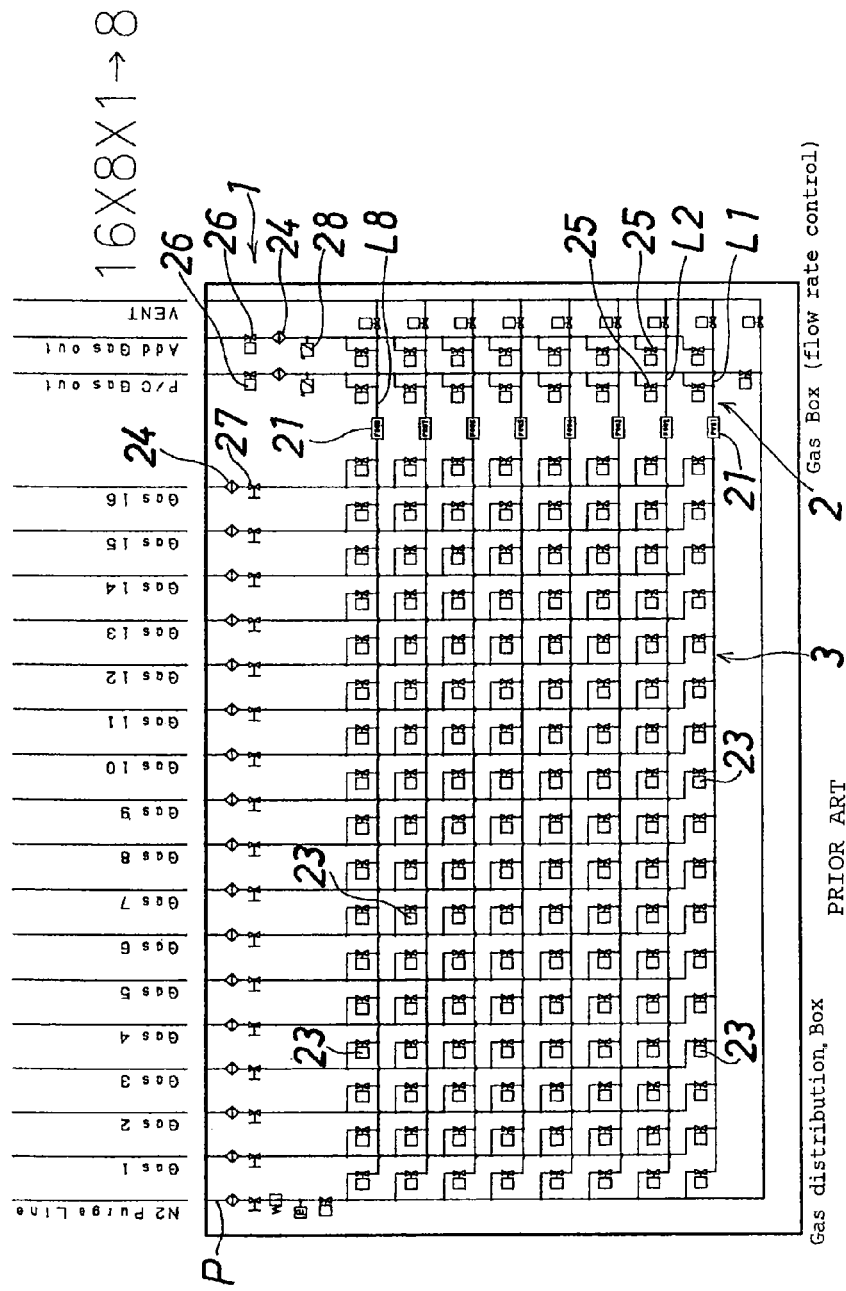
FIG. 6 is a flowchart showing a conventional fluid control apparatus which is a comparative example for the fluid control apparatus according to the present invention.
Figure 7:
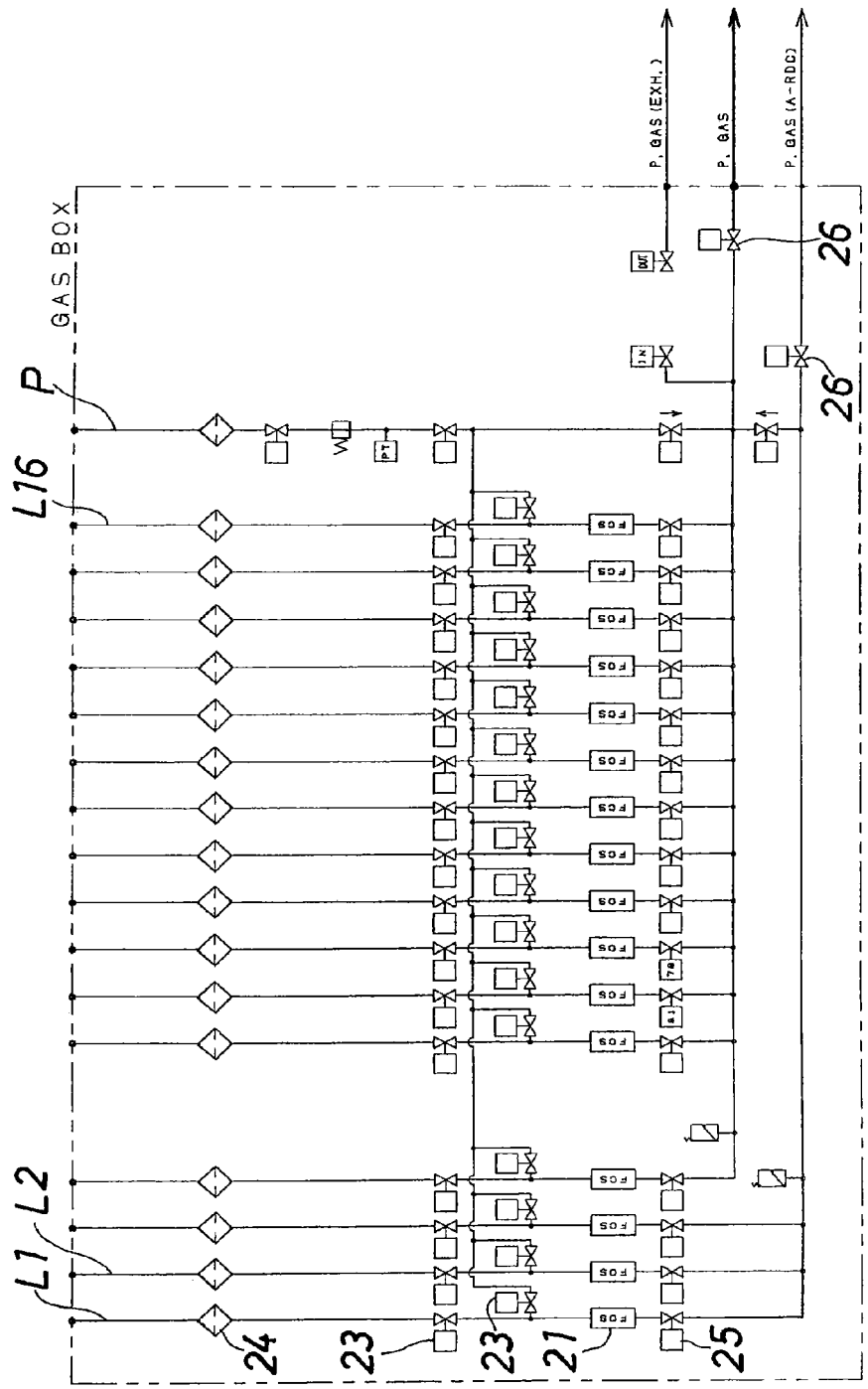
FIG. 7 is a flowchart showing other example of a conventional fluid control apparatus.

In the following, embodiments of the present invention will be described with reference to drawings. In the following description, the same element as shown in FIG. 6 is denoted by the same reference numeral, and the description thereof is omitted.

FIG. 1 shows a first embodiment of the fluid control apparatus according to the present invention.

The fluid introducing unit (3) of the present embodiment is divided into three parts: a first and a second inlet-side shutoff/open parts (5)(6) disposed on the inlet side, each including 2×N/2 on-off valves (23), and a fluid controlling unit-side shutoff/open part (7) disposed between the first and second inlet-side shutoff/open parts (5)(6) and a fluid controlling unit (2), including 4×M on-off valves (23).

The first and second inlet-side shutoff/open parts (5)(6) divide N inlets into two inlet-side shutoff/open parts, and each has N/2 inlets and two outlets. As a result, the total number of outlets of the first and second inlet-side shutoff/open parts (5)(6) (number of inlets for the fluid controlling unit-side shutoff/open part (7)) is (2+2), and by forming the fluid controlling unit-side shutoff/open part (7) of 4×M on-off valves (23) in correspondence with the total of 4 outlets, M outlets are obtained in the fluid introducing unit (3) as a whole, and M outlets of the fluid introducing unit (3) and M inlets of the fluid controlling unit (2) are connected one-on-one.

In the constitution shown in FIG. 6, M kinds (8 kinds) at a maximum of fluids can be introduced to the fluid controlling unit (2) at the same time. However, practically, it suffices that four kinds at a maximum of fluids can be introduced to the fluid controlling unit (2) at the same time, and under this condition, by designing as is the first embodiment, the number of the on-off valves (23) can be reduced. Here, in this embodiment, the number of outlets is two in both the first and second inlet-side shutoff/open parts (5)(6), and in introducing four kinds of fluids at the same time, since the four kinds of fluids cannot be introduced to one of the first and second inlet-side shutoff/open parts (5)(6), two kinds of fluids are introduced to each of the first and second inlet-side shutoff/open parts (5)(6).

In this manner, according to the constitution of the first embodiment, the number of the on-off valves (23) is reduced from N×M to (2N+4×M) in comparison with the constitution shown in FIG. 6.

Figure 2:
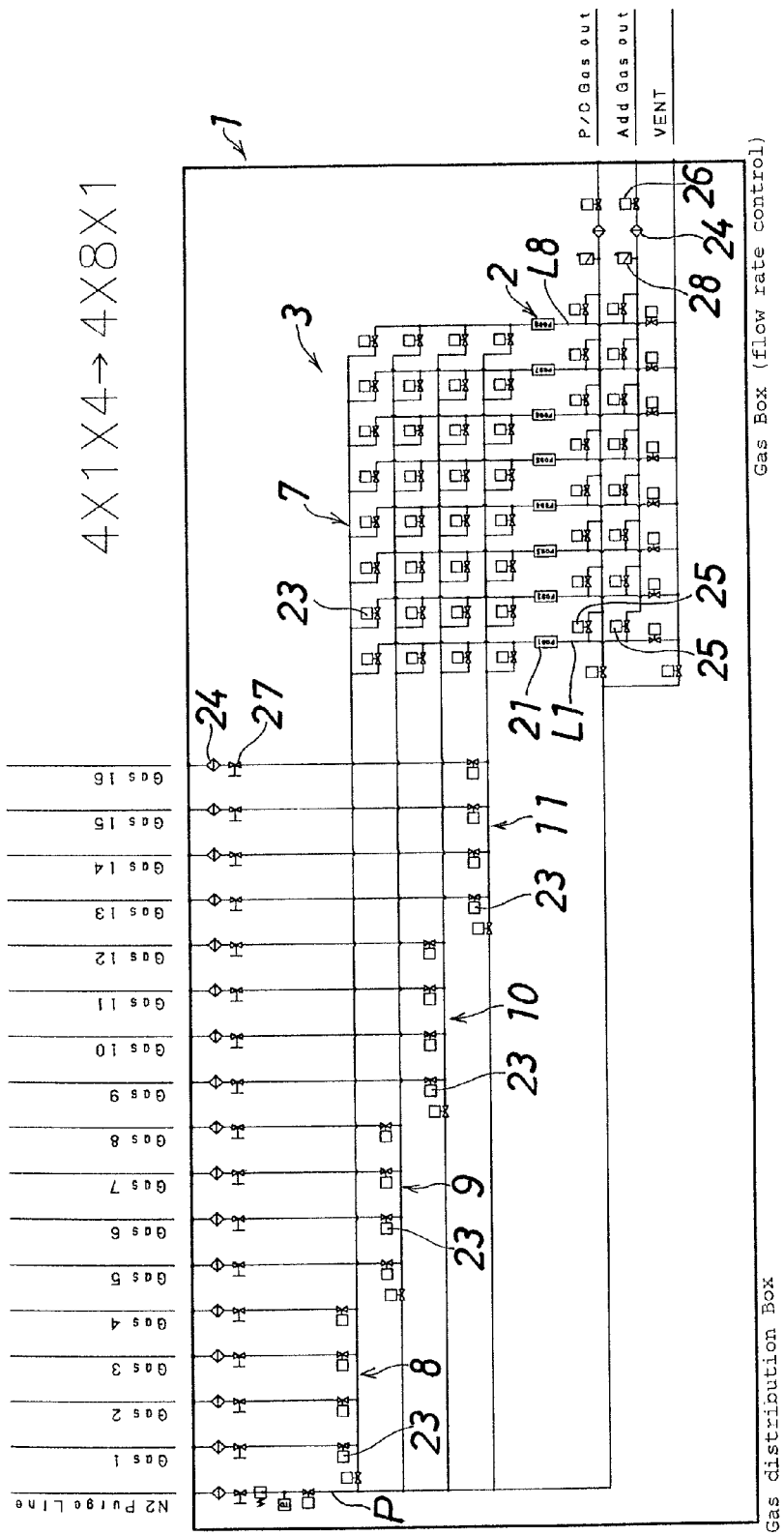
FIG. 2 is a flow chart showing a second embodiment of the fluid control apparatus according to the present invention.

FIG. 2 shows a second embodiment of the fluid control apparatus of the present invention.

A fluid introducing unit (3) of the present embodiment is divided into five parts: a first to a fourth inlet-side shutoff/open parts (8)(9)(10)(11) disposed on the inlet side, each including N/4 on-off valves (23), and a fluid controlling unit-side shutoff/open part (7) including 4×M on-off valves (23), disposed between the first to fourth inlet-side shutoff/open parts (8)(9)(10)(11) and a fluid controlling unit (2).

The fluid controlling unit-side shutoff/open part (7) has the same constitution as that of the first embodiment. A difference from the first embodiment lies in that the first and second inlet-side shutoff/open parts (5)(6) in the first embodiment are further divided, and the four inlet-side shutoff/open parts (8)(9)(10)(11) are formed. According to the constitution of the second embodiment, since each one kind of fluid is introduced into each of the first to fourth inlet-side shutoff/open parts (8)(9)(10)(11), the total number of outlets (the number of inlets for the fluid controlling unit-side shutoff/open part (7)) of the first to fourth inlet-side shutoff/open parts (8)(9)(10)(11) is four (1+1+1+1) likewise the first embodiment, and by assigning the total of four outlets to respective inlets of the fluid controlling unit-side shutoff/open part (7) including 4×M on-off valves (23), respectively, M outlets are obtained in the fluid introducing unit (3) as a whole, and the M outlets of the fluid introducing unit (3) and M inlets of the fluid controlling unit (2) are connected one-on-one.

In this manner, according to the constitution of the second embodiment, the number of on-off valves (23) is reduced by N in comparison with the first embodiment.

Figure 3:
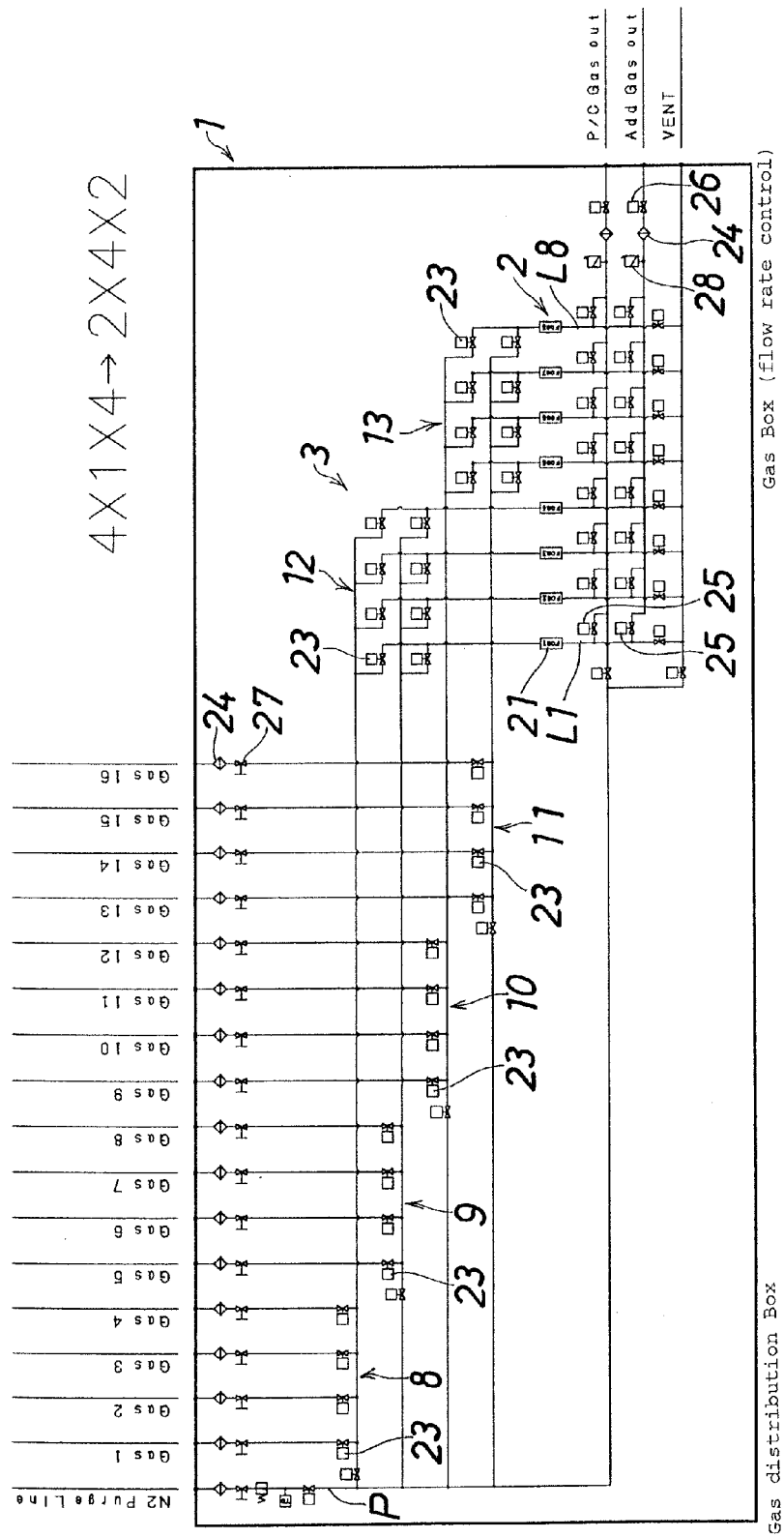
FIG. 3 is a flow chart showing a third embodiment of the fluid control apparatus according to the present invention.

FIG. 3 shows a third embodiment of the fluid control apparatus of the present invention.

A fluid introducing unit (3) of the present embodiment is divided into 6 parts: a first to a fourth inlet-side shutoff/open parts (8)(9)(10)(11) disposed on the inlet side, each including N/4 on-off valves (23), and a first and a second fluid controlling unit-side shutoff/open parts (12)(13) each including 2×M/2 on-off valves (23), disposed between the first to fourth inlet-side shutoff/open parts (8)(9)(10)(11) and a fluid controlling unit (2).

The first to fourth inlet-side shutoff/open parts (8)(9)(10)(11) have the same constitution as that of the second embodiment. A difference between the third embodiment and the second embodiment lies in that the fluid controlling unit-side shutoff/open part (7) in the second embodiment is divided into two fluid controlling unit-side shutoff/open parts (12)(13). The first and second fluid controlling unit-side shutoff/open parts (12)(13) as a whole have four inlets and M outlets, likewise the case of the second embodiment.

Therefore, according to the constitution of the third embodiment, since each one kind of fluid is introduced into each of the first to fourth inlet-side shutoff/open parts (8)(9)(10)(11), the total number of outlets (the number of inlets for the fluid controlling unit-side shutoff/open parts (12)(13)) of the first to fourth inlet-side shutoff/open parts (8)(9)(10)(11) is four (1+1+1+1) likewise the second embodiment, and by assigning the total of four outlets to the two inlets of the first fluid controlling unit-side shutoff/open part (12) and the two inlets of the second fluid controlling unit-side shutoff/open part (13), M outlets are obtained in the fluid controlling unit-side shutoff/open parts (12)(13) as a whole (fluid introducing unit (3) as a whole), and the M outlets of the fluid introducing unit (3) and M inlets of the fluid controlling unit (2) are connected one-on-one.

In this manner, according to the constitution of the third embodiment, the number of on-off valves (23) of the fluid controlling unit-side shutoff/open parts (12)(13) is reduced by half (M/2), in comparison with the second embodiment.

Figure 4:
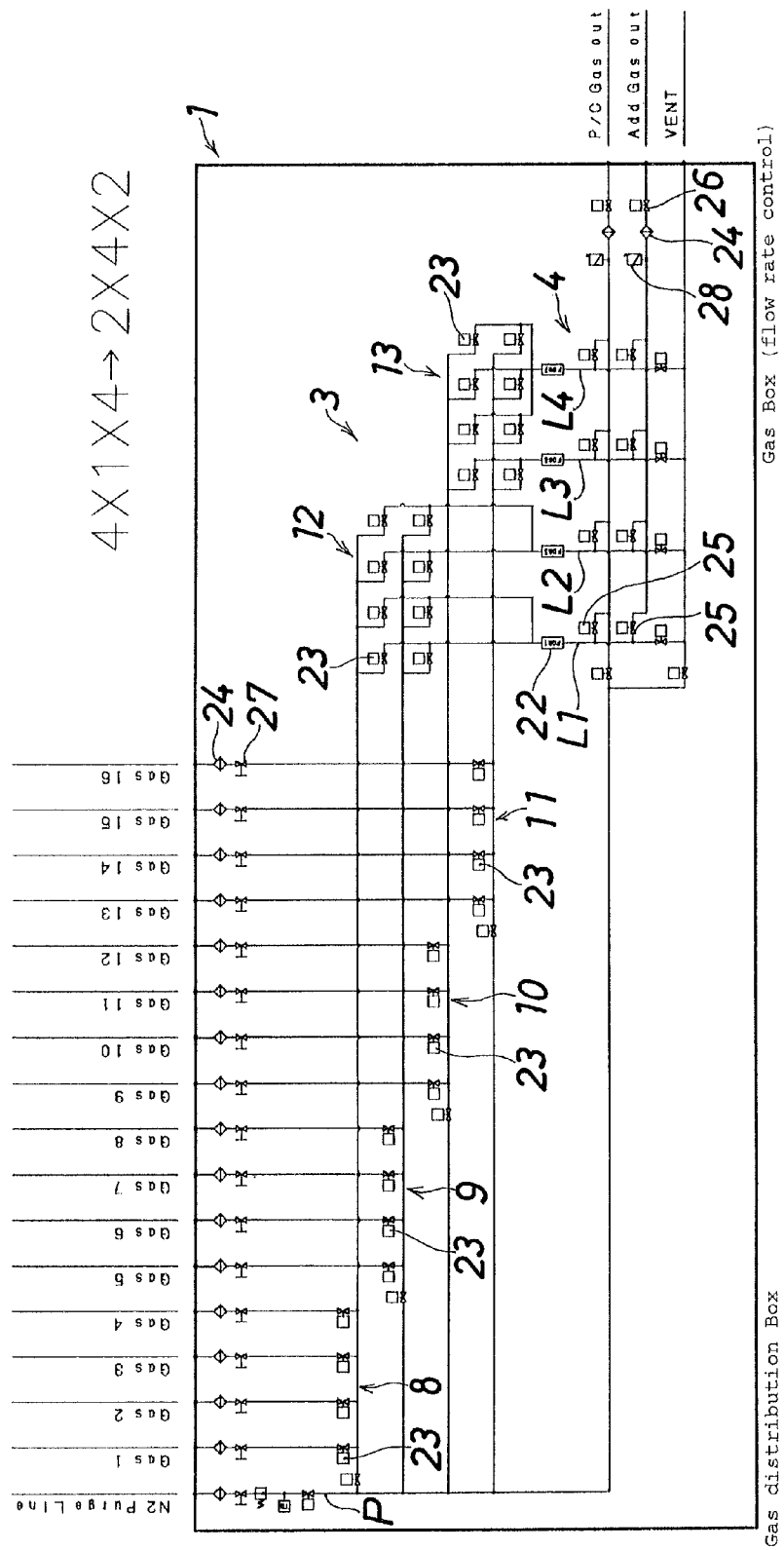
FIG. 4 is a flow chart showing a fourth embodiment of the fluid control apparatus according to the present invention.

FIG. 4 shows a fourth embodiment of the fluid control apparatus of the present invention. The constitution of the fourth embodiment differs from the constitution of the third embodiment in configuration of the fluid controlling units (2)(4).

In the constitution of the fourth embodiment, the flow rate controller (22) is of a pressure type in place of a mass flow controller (21).

Figure 5:
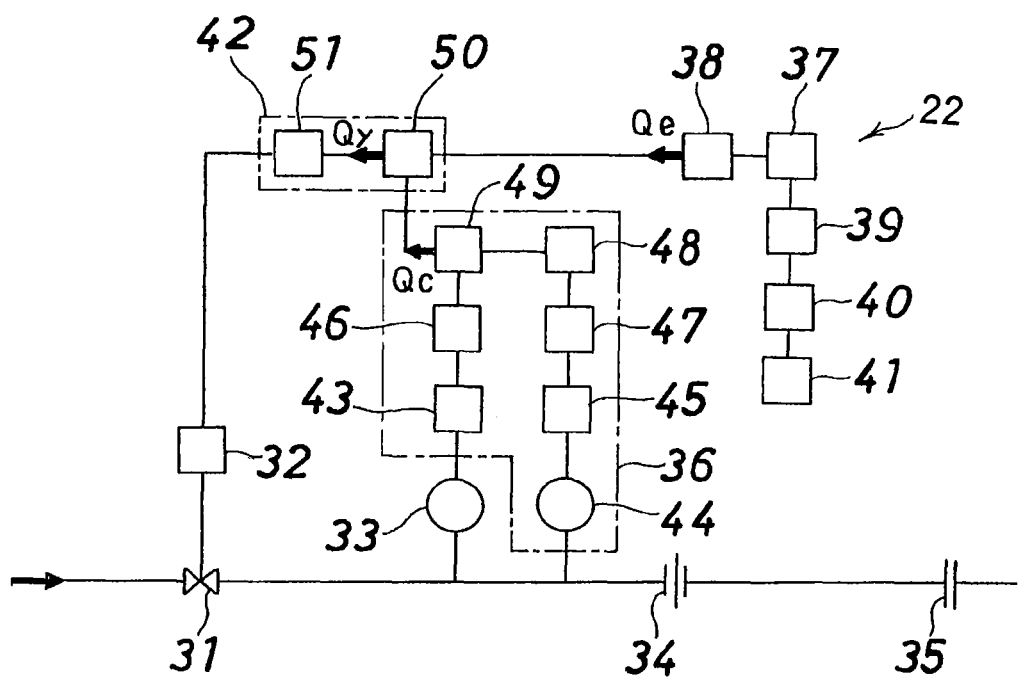
FIG. 5 is a block diagram showing a flow rate controller used in the fourth embodiment of the fluid control apparatus according to the present invention.

As shown in FIG. 5, the flow rate controller (22) is made up of a control valve (31), a driving part (32) thereof, a pressure detector (33), an orifice (34), a fluid ejecting connector (35), a flow rate operation circuit (36), a fluid kind selecting circuit (37), a flow rate setting circuit (38), a specific FF storage part (39), a flow rate operation part (40), flow rate display part (41) and an operation control circuit (42).

The flow rate operation circuit (36) is made up of a temperature detector (44), amplification circuits (43)(45), A/D converters (46)(47), a temperature correction circuit (48) and an operation circuit (49). The operation control circuit (42) is made up of a comparison circuit (50) and an amplification circuit (51).

A so-called direct touch type metal diaphragm valve is used in the control valve (31), and a piezoelectric element type driver is used in the driving part (32) thereof. Besides the above, an electrostrictive element type driver, a solenoid type driver, motor type driver, an air pressure type driver, or a thermal expansion type driver are used as a driving part.

While a semiconductor distortion type pressure sensor is used in the pressure detector (33), as the pressure detector, a metal foil distortion type pressure sensor, a electrostatic capacity type sensor, a magnetic reluctance type pressure sensor or the like may be used besides the above. While a thermo couple type temperature sensor is used in the temperature detector (44), known various temperature sensors such as a temperature detecting resistance type temperature sensor may also be used.

The orifice (34) is provided by a fine hole formed by piercing a gasket of a metal thin sheet by cutting so as to have a desired flow rate characteristic. Besides the above, the orifice having a hole formed in a metal film by etching and electric discharge machining may be used.

The fluid kind selecting circuit (37) selects the fluid, and the flow rate setting circuit (38) commands the operation control circuit (42) with its flow rate setting signal Qe. The specific FF storage part (39) is memory that stores specific FF for $N_2$ gas. The flow rate operation part (40) operates a flow rate Q of a circulating fluid kind using data of the specific FF, according to Q=specific FF×$Q_N$ ($Q_N$ represents corresponding $N_2$ gas flow rate), and displays this value on the display part (41).

The flow rate controller (22) is so configured that it is able to operate a flow rate Qc on the downstream side for a specific fluid by Qc=K×P (K: constant) while keeping the upstream pressure about twice or more the downstream pressure, and the control valve (31) is on-off controlled by a differential signal between the operated flow rate Qc and a set flow rate Qs.

Here, flow factor FF is calculated for each fluid kind according to the following formula.

$$FF=(k/\gamma)\{2/(\kappa+1)\}^{1/(\kappa-1)}[\kappa/\{(\kappa+1)R\}]^{1/2}$$

γ: density of fluid in normal state, κ: ratio of specific heat of fluid, R: fluid constant, k: constant of proportionality independent of fluid kind Then, in the flow rate operation part (40), when the operated flow rate of fluid kind A serving as a reference is Qa, an operated flow rate Qb at the time of circulating flow kind B in the conditions of the same orifice, the same upstream pressure and the same upstream temperature is calculated by Qb=specific flow factor×Qa using a specific flow factor of fluid kind B to fluid kind A stored in the specific FF storage part (39).

In this manner, it is possible to make one flow rate controller (22) support a plurality of kinds of fluids, and according to the constitution of the fourth embodiment, by using this, it is possible to reduce the M flow rate controllers (21) in the third embodiment to m (for example, half) flow rate controllers (22). The number of reduced flow rate controllers (22) is appropriately varied depending on the kind of fluid and the flow rate range.

The fluid controlling unit (4) of the fourth embodiment is also applicable to the fluid control apparatuses (1) of the first to the third embodiments, and in this manner, it is possible to reduce the number of the flow rate controllers (21) in each embodiment.

Industrial Applicability

Since the cost and the space can be reduced in a fluid control apparatus formed by integration of a plurality of fluid control devices, by applying this to a fluid control apparatus used in a semiconductor production apparatus or the like, it is possible to contribute to the improvement in performance of the semiconductor production apparatus or the like.

The invention claimed is:

1. A fluid control apparatus comprising:
a fluid controlling unit including M fluid control lines each having one flow rate controller as a basic constituting element, one inlet and one outlet, and
a fluid introducing unit configured to introduce a plurality of fluids to the fluid controlling unit, and having N inlets and M outlets by a plurality of on-off valves, where N is greater than M and the M outlets of the fluid introducing unit and M inlets of the fluid controlling unit being connected one-on-one,
wherein the fluid introducing unit is divided into an inlet-side shutoff/open part made up of a plurality of on-off valves, disposed on the inlet side, having a total of N inlets and a total of K outlets, and a fluid controlling unit-side shutoff/open part made up of a plurality of on-off valves, disposed between the inlet-side shutoff/open part and the fluid controlling unit, having a total of K inlets and a total of M outlets, and the inlet-side shutoff/open part is divided into a plurality of groups each having two or more required number of on-off valves, and
wherein the fluid introducing unit comprises a first and a second inlet-side shutoff/open parts respectively made up of N1×2 on-off valves and (N−N1)×2 on-off valves, and a fluid controlling unit-side shutoff/open part made up of 4×M on-off valves.

2. The fluid control apparatus according to claim 1, wherein the flow rate controller is of a pressure type that executes flow rate control of a fluid while keeping an upstream pressure of an orifice about twice or more a downstream pressure, the flow rate controller including said orifice which is formed by piercing a fine hole in a metal thin sheet, with a desired flow rate characteristic, a control valve provided upstream the orifice, a pressure detector provided between the control valve and the orifice, and an operation control device that operates flow rate Qc from a detected pressure P of the pressure detector according to Qc=K×P wherein K is constant, and outputs a difference between a flow rate command signal Qs and the operated flow rate signal Qc to a driving part of the control valve as a control signal Qy, wherein the upstream pressure of the orifice is adjusted by opening/closing of the control valve to control the flow rate downstream the orifice, and the M fluid control lines having M flow rate controllers are replaced by M fluid control lines having the m pressure type flow rate controllers, wherein m is less than M.

3. A fluid control apparatus comprising:

a fluid controlling unit including M fluid control lines each having one flow rate controller as a basic constituting element, one inlet and one outlet, and a fluid introducing unit configured to introduce a plurality of fluids to the fluid controlling unit, and having N inlets and M outlets by a plurality of on-off valves, where N is greater than M and the M outlets of the fluid introducing unit and M inlets of the fluid controlling unit being connected one-on-one, wherein the fluid introducing unit is divided into an inlet-side shutoff/open part made up of a plurality of on-off valves, disposed on the inlet side, having a total of N inlets and a total of K outlets, and a fluid controlling unit-side shutoff/open part made up of a plurality of on-off valves, disposed between the inlet-side shutoff/open part and the fluid controlling unit, having a total of K inlets and a total of M outlets, and the inlet-side shutoff/open part is divided into a plurality of groups each having two or more required number of on-off valves, and wherein the fluid introducing unit comprises, assuming N=N1+N2+N3+N4, a first to a fourth inlet-side shutoff/open parts respectively made up of N1, N2, N3 and N4 on-off valves, and a fluid controlling unit-side shutoff/open part made up of 4×M on-off valves.

4. The fluid control apparatus according to claim 3, wherein the flow rate controller is of a pressure type that executes flow rate control of a fluid while keeping an upstream pressure of an orifice about twice or more a downstream pressure, the flow rate controller including an said orifice, which is formed by piercing a fine hole in a metal thin sheet, with a desired flow rate characteristic, a control valve provided upstream the orifice, a pressure detector provided between the control valve and the orifice, and an operation control device that operates flow rate Qc from a detected pressure P of the pressure detector according to Qc=K×P wherein K is constant, and outputs a difference between a flow rate command signal Qs and the operated flow rate signal Qc to a driving part of the control valve as a control signal Qy, wherein the upstream pressure of the orifice is adjusted by opening/closing of the control valve to control the flow rate downstream the orifice, and the M fluid control lines having M flow rate controllers are replaced by M fluid control lines having the m pressure type flow rate controllers, wherein m is less than M.

5. A fluid control apparatus comprising:

a fluid controlling unit including M fluid control lines each having one flow rate controller as a basic constituting element, one inlet and one outlet, and a fluid introducing unit configured to introduce a plurality of fluids to the fluid controlling unit, and having N inlets and M outlets by a plurality of on-off valves, where N is greater than M and the M outlets of the fluid introducing unit and M inlets of the fluid controlling unit being connected one-on-one, wherein the fluid introducing unit is divided into an inlet-side shutoff/open part made up of a plurality of on-off valves, disposed on the inlet side, having a total of N inlets and a total of K outlets, and a fluid controlling unit-side shutoff/open part made up of a plurality of on-off valves, disposed between the inlet-side shutoff/open part and the fluid controlling unit, having a total of K inlets and a total of M outlets, and the inlet-side shutoff/open part is divided into a plurality of groups each having two or more required number of on-off valves, and wherein the fluid introducing unit comprises a first to a fourth inlet-side shutoff/open parts respectively made up of N/4 on-off valves, and a first and a second fluid controlling unit-side shutoff/open parts respectively made up of 2×M/2 on-off valves.

6. The fluid control apparatus according to claim 5, wherein the flow rate controller is of a pressure type that executes flow rate control of a fluid while keeping an upstream pressure of an orifice about twice or more a downstream pressure, the flow rate controller including said orifice, which is formed by piercing a fine hole in a metal thin sheet, with a desired flow rate characteristic, a control valve provided upstream the orifice, a pressure detector provided between the control valve and the orifice, and an operation control device that operates flow rate Qc from a detected pressure P of the pressure detector according to Qc=K×P wherein K is constant, and outputs a difference between a flow rate command signal Qs and the operated flow rate signal Qc to a driving part of the control valve as a control signal Qy, wherein the upstream pressure of the orifice is adjusted by opening/closing of the control valve to control the flow rate downstream the orifice, and the M fluid control lines having M flow rate controllers are replaced by M fluid control lines having the m pressure type flow rate controllers, wherein m is less than M.

* * * * *